(12) United States Patent  
Churchill et al.

(10) Patent No.: US 7,646,135 B1  
(45) Date of Patent: Jan. 12, 2010

(54) INTEGRATED PIEZOELECTRIC COMPOSITE AND SUPPORT CIRCUIT

(75) Inventors: David L. Churchill, Burlington, VT (US); Steven W. Arms, Williston, VT (US); James Marc Leas, South Burlington, VT (US)

(73) Assignee: MicroStrain, Inc., Williston, VT (US)

( * ) Notice: Subject to any disclaimer, the term of this patent is extended or adjusted under 35 U.S.C. 154(b) by 76 days.

(21) Appl. No.: 11/644,334

(22) Filed: Dec. 22, 2006

Related U.S. Application Data

(60) Provisional application No. 60/753,679, filed on Dec. 22, 2005, provisional application No. 60/762,632, filed on Jan. 26, 2006.

(51) Int. Cl.  
*H01L 41/08* (2006.01)

(52) U.S. Cl. .................... 310/313 R; 310/317; 310/319

(58) Field of Classification Search .................. 310/317, 310/319, 324, 343, 313 R, 329  
See application file for complete search history.

(56) References Cited

U.S. PATENT DOCUMENTS

| | | | | |
|---|---|---|---|---|
| 3,431,392 A | * | 3/1969 | Garland et al. | 219/210 |
| 3,564,303 A | * | 2/1971 | Geil et al. | 310/319 |
| 4,555,953 A | * | 12/1985 | Dario et al. | 73/862.046 |
| 4,600,851 A | * | 7/1986 | Isayama et al. | 310/324 |
| 6,048,622 A | | 4/2000 | Hagood | |
| 6,191,519 B1 | * | 2/2001 | Nye et al. | 310/316.01 |
| 6,404,107 B1 | * | 6/2002 | Lazarus et al. | 310/328 |
| 7,081,693 B2 | | 3/2003 | Hamel | |
| 6,580,177 B1 | * | 6/2003 | Hagood et al. | 290/1 R |
| 6,629,341 B2 | | 10/2003 | Wilkie | |
| 6,995,496 B1 | | 2/2006 | Hagood | |
| 2003/0234730 A1 | | 12/2003 | Arms | |
| 2005/0017602 A1 | | 1/2005 | Arms | |
| 2005/0146220 A1 | | 7/2005 | Hamel | |
| 2005/0179341 A1 | * | 8/2005 | Brantner | 310/319 |
| 2006/0213278 A1 | | 9/2006 | Arms | |

* cited by examiner

*Primary Examiner*—Mark Budd  
(74) *Attorney, Agent, or Firm*—James Marc Leas

(57) ABSTRACT

A module includes a first piezoelectric element and first electronic device. The first piezoelectric provides physical support for said first electronic device. One embodiment includes a first insulating layer. The first insulating layer is mounted on the first piezoelectric element. The first electronic device is mounted on the first insulating layer for providing an electronic support function to the first piezoelectric element. In one embodiment the first electronic device includes a rectifier. One embodiment includes multiple contacts to the piezoelectric element each with its own rectifier. Another embodiment includes a stack of piezoelectric elements.

45 Claims, 11 Drawing Sheets

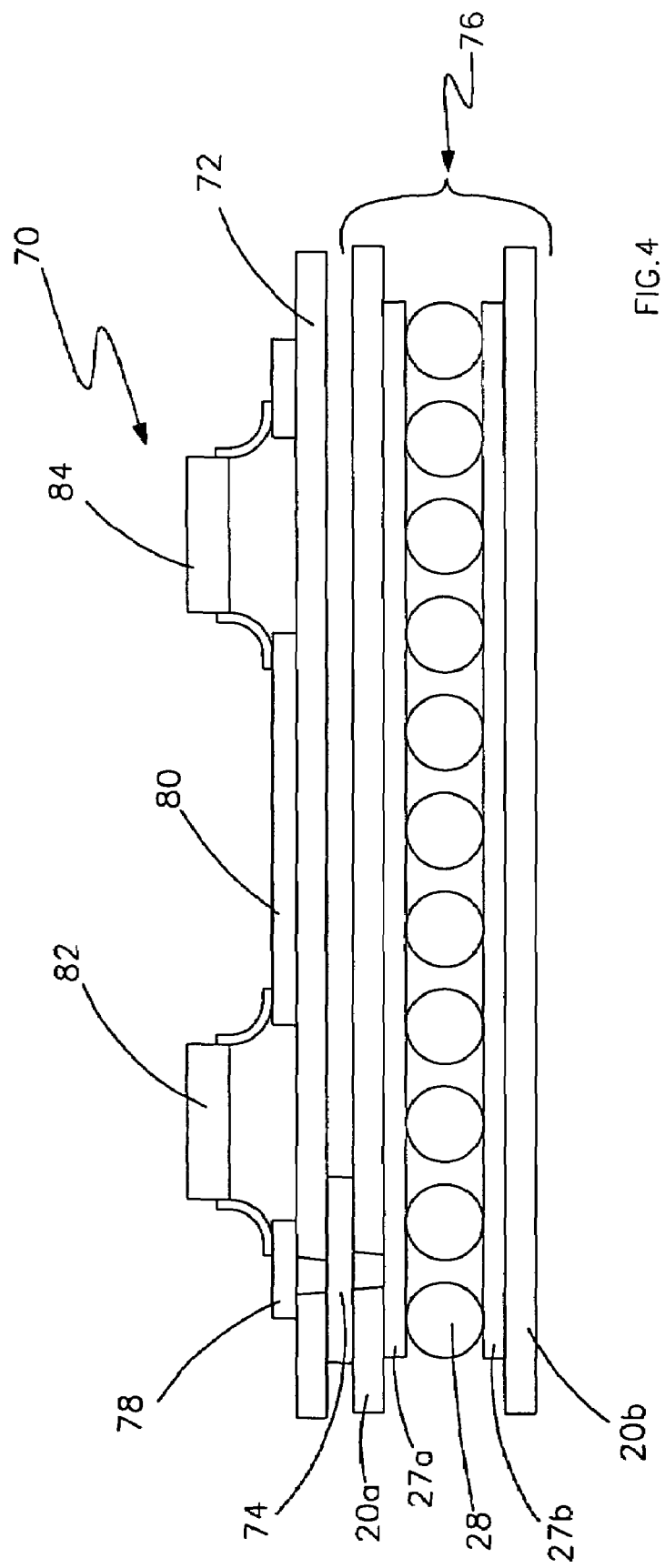

US 7,646,135 B1

INTEGRATED PIEZOELECTRIC COMPOSITE AND SUPPORT CIRCUIT

RELATED APPLICATIONS AND PRIORITY

This application claims priority of Provisional Patent Application 60/753,679, filed Dec. 22, 2005 and Provisional Patent Application 60/762,632, filed Jan. 26, 2006, both of which are incorporated herein by reference.

This application is related to the following commonly assigned patent applications:

"Energy Harvesting for Wireless Sensor Operation and Data Transmission," U.S. Pat. No. 7,081,693 to M. Hamel et al., filed Mar. 5, 2003 ("the '693 patent").

"Shaft Mounted Energy Harvesting for Wireless Sensor Operation and Data Transmission," U.S. patent application Ser. No. 10/769,642 to S. W. Arms et al., filed Jan. 31, 2004 ("the '642 application").

"Robotic system for powering and interrogating sensors," U.S. patent application Ser. No. 10/379,224 to S. W. Arms et al, filed Mar. 5, 2003 ("the '224 application").

"Miniature Acoustic Stimulating and Sensing System," U.S. patent application Ser. No. 11/368,731 to J. Robb et al, filed Mar. 6, 2006 ("the '731 application").

"Energy Harvesting, Wireless Structural Health Monitoring System," U.S. patent application Ser. No. 11/518,777, to S. W. Arms et al, filed Sep. 11, 2006 ("the "777 application").

"Structural Damage Detection and Analysis System," U.S. Provisional Patent Application No. 60/729,166 to M. Hamel, filed Oct. 21, 2005, ("the '166 application").

"Sensor Powered Event Logger," U.S. Provisional Patent Application No. 60/753,481 to D. L. Churchill et al, filed Dec. 22, 2005, ("the '481 application").

"Strain Gauge with Moisture Barrier and Self-Testing Circuit," U.S. patent application Ser. No. 11/091,244 to S. W. Arms et al, filed Mar. 28, 2005, ("the '244 application").

All of the above listed patents and patent applications are incorporated herein by reference.

This invention was made with Government support under contract number N6833506C0218, awarded by the US Department of the Navy. The Government has certain rights in the invention.

FIELD

This patent application generally relates to a system for integrating a piezoelectric composite and support devices.

BACKGROUND

Piezoelectric elements are used as sensors, actuators, and energy harvesting devices. Vibration or strain in a workpiece can be sensed from the electricity the piezoelectric element produces. That electricity can also be harvested to provide power for such things as charging a capacitor, recharging a battery, powering an electronic circuit, logging data from a sensor, or transmitting that data.

Alternatively, electricity from an external source can be provided to the piezoelectric element causing it to strain or vibrate. If mounted on a substrate this strain or vibration can be transferred to the substrate. The external source can include a power supply and function generator. A pulse of electricity having a particular amplitude variation or that includes a particular set of frequencies can be provided from the function generator to the piezoelectric element to impart a desired vibration to the substrate.

Thus, piezoelectric elements have been combined with support circuits including signal conditioning, energy harvesting, and signal generator circuits. Each of these support circuits includes a variety of electronic components, such as capacitors, resistors, inductors, transistors, memories, integrated circuits, batteries, transmitters, and the like. These components have typically been mounted and wired together on a printed circuit board. The piezoelectric elements and the printed circuit board have been separately mounted on the substrate and wiring provided there between.

Commercially available piezoelectric composites have been constructed from a piezoelectric element composed of an array of parallel fibers of a piezoelectric material. The piezoelectric element has been sandwiched between two sheets of metalized polyimide, as described in U.S. Pat. No. 6,629,341 to Wilkie, et al. ("the '341 patent"), incorporated herein by reference. One of the sheets of polyimide has a pair of metal pads on a top surface in electrical contact with metalization layers on inner surfaces of the polyimide sheets contacting each surface of the piezoelectric element. Wiring has been connected to the pair of contact pads extending to the printed circuit board carrying the support circuits.

Providing piezoelectric composites and circuit boards with support circuits, mounting them on a substrate, and connecting the piezoelectric composites to their support circuits has posed difficulties, and a system has not yet been optimized for this purpose. Thus, an improved system is needed, and this system is provided in the present patent application.

SUMMARY

One aspect of the present patent application is a module including a piezoelectric element, a first insulating layer, and an electronic device. The first insulating layer is mounted on the piezoelectric element. A pair of contacts to the piezoelectric element, wiring traces, and pads are included in the first insulating layer. The electronic device is mounted to the pads for providing an electronic support function to the piezoelectric element.

BRIEF DESCRIPTION OF THE DRAWINGS

The foregoing will be apparent from the following detailed description as illustrated in the accompanying drawings, for clarity not drawn to scale, in which:

FIG. 4 is a cross sectional view of another embodiment including a flex layer bonded to a standard piezoelectric composite with support circuits mounted on the flex layer;

FIG. 6c' is a top view of another embodiment of a large stack in which an insulating layer of each piezoelectric composite extends beyond its piezoelectric element and metalization extending on each of these insulating layers are interconnected to each other and to support circuits;

DETAILED DESCRIPTION

In one embodiment electrical traces and contact pads for support circuits are formed on the same insulator layer and using the same photolithographic process presently used just to provide the two piezoelectric contact pads. Electronic components are mounted to the support circuit contact pads so formed on this insulator. Thus, contact pads and wiring traces for support circuits are integrated in the manufacture of the piezoelectric composites. In this scheme the piezoelectric composite and its insulator become the carrier for the support circuits. The separate printed circuit board and the wiring connecting the piezoelectric composite with the printed circuit board are eliminated.

In another embodiment, a flex is provided and mounted on a standard piezoelectric composite that has the standard pair of contact pads. Flex is a free standing layer of an insulator, such as polyimide, that has conductive traces and pads patterned on one or both sides with vias there between. Flex can be multilayered with vias providing electrical connection from one layer to the next. In this embodiment, pads and wiring traces are provided on the flex for mounting support circuits. This embodiment avoids redesign of metalization on the piezoelectric composite itself.

Figure 1A:
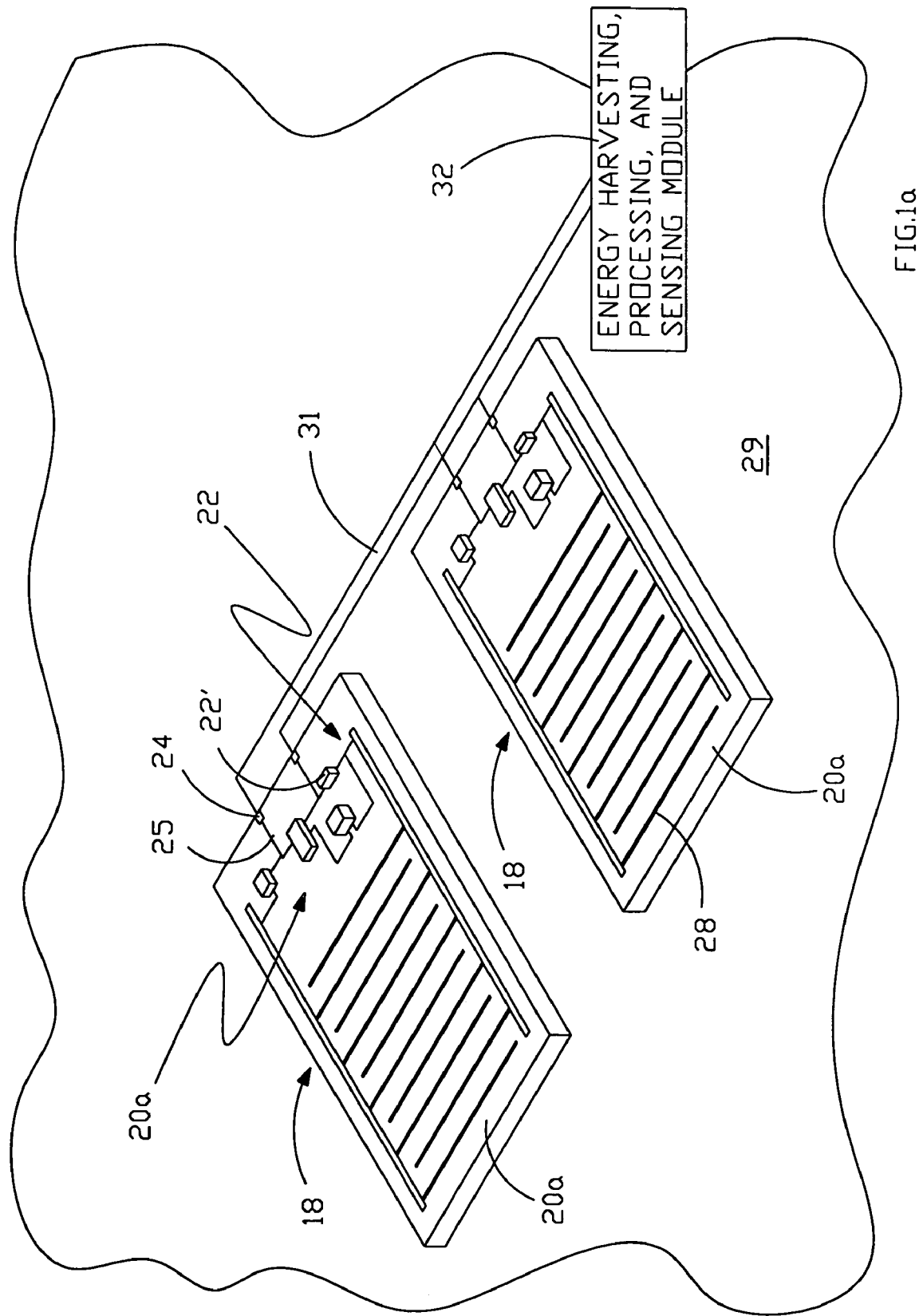
FIG. 1a is a three dimensional view of one embodiment of piezoelectric composites with an integrated diode bridge connected to an energy harvesting, processing and sensing module.
Figure 1B:
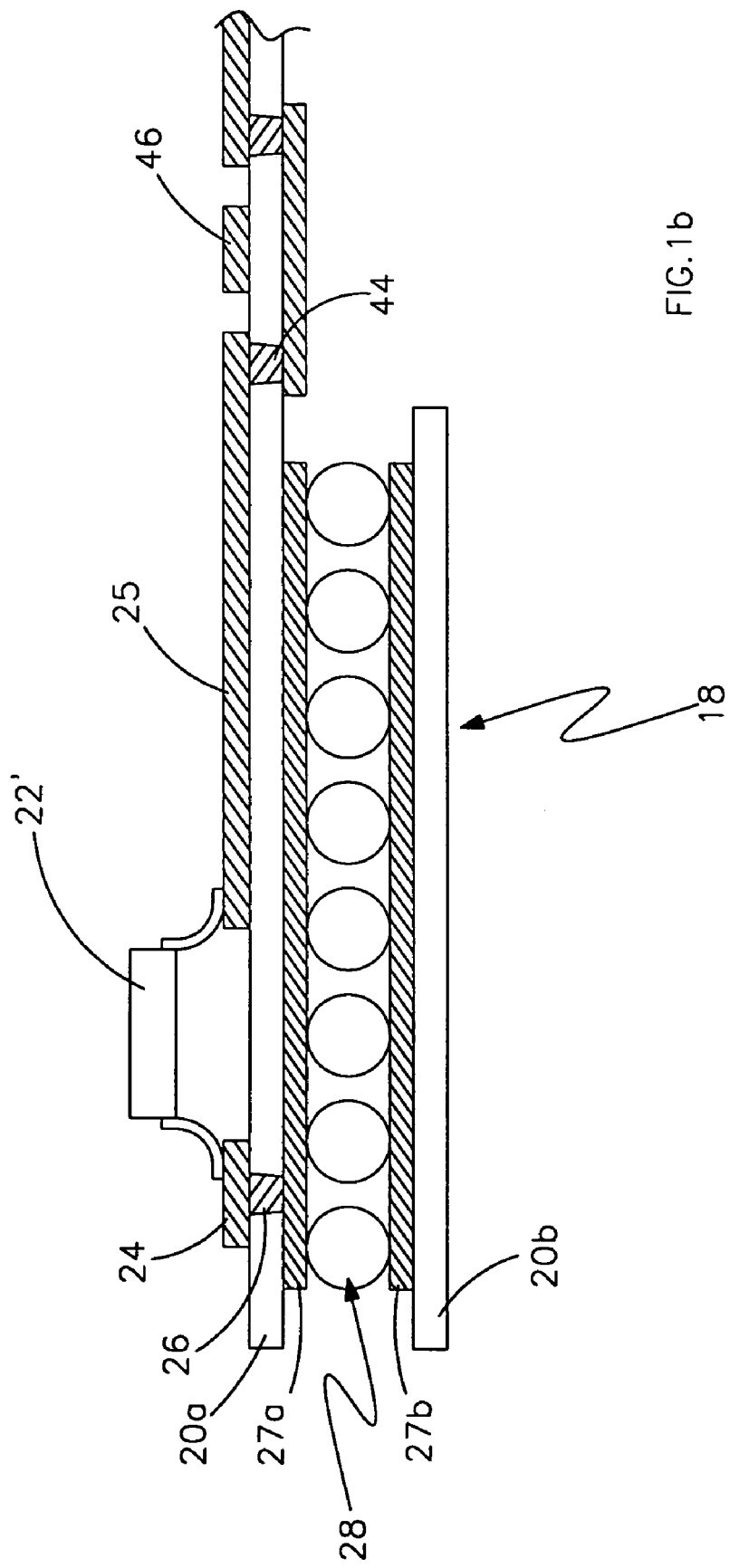
FIG. 1b is a cross sectional view of one of the piezoelectric composites of FIG. 1a with an insulating layer having metalization on both sides and vias there between, and showing the diode bridge mounted on a top surface.

In the first embodiment, integrated piezoelectric composite 18 has area of insulator 20a that has normally been used just for a pair of piezoelectric contact pads enlarged so it can also be used for support circuits, such as diode bridge 22 including diodes 22', as shown in FIGS. 1a, 1b.

Electrical pads 24, for mounting components and making external contact, traces 25, for interconnecting components, and vias 26, for connecting between metalization layers on both sides of insulator 20a, are formed by photolithography during manufacture of piezoelectric composite 18. Electrodes 27a, 27b are formed on insulators 20a, 20b and mounted to piezoelectric fibers 28 of integrated piezoelectric composite 18, as described in the '341 patent. Electronic components, such as diodes 22', are then soldered, wire bonded, or conductive epoxy bonded to electrical pads 24.

Several such integrated piezoelectric composites 18 can be mounted to substrate 29, as shown in FIG. 1a. Diode bridges 22 are integrated on insulator 20a on each integrated piezoelectric composite 18. Outputs of each diode bridge 22 are connected to wires 31 extending to single energy harvesting, processing, and sensing module 32 which is further illustrated in FIGS. 3a, 3b.

Figure 2:
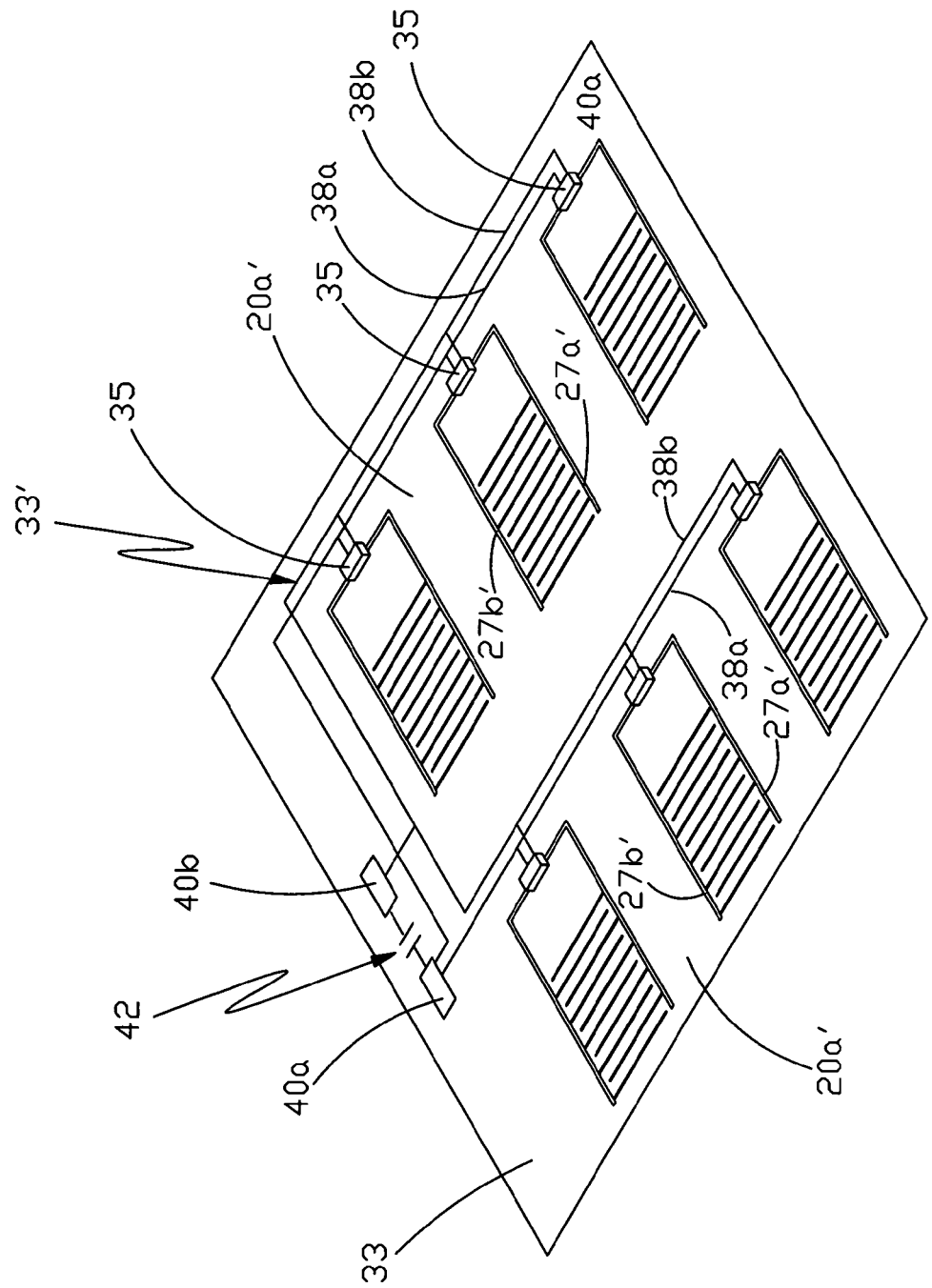
FIG. 2 is a three dimensional view of another embodiment of a large piezoelectric composite with smaller regions each having an integrated diode bridge, and in which all the diode bridges are connected in parallel to common electrodes and support circuitry.

In another embodiment, single large area layer of piezoelectric fiber material 33 is electrically segregated into smaller areas 33', each of which has its own electrodes 27a', 27b' connected to its own smaller area 33' of single large area layer of piezoelectric fiber material 33, as shown in FIG. 2. Electrodes 27a', 27b' are also connected to individual rectifier bridges 35 mounted on insulator 20a' for each small area 33'. Under conditions where single large area layer of piezoelectric fiber material 33 is exposed to a varying strain field this arrangement is advantageous, as current generated in a high strain region would be blocked by rectifier bridges 35 from being dissipated in a lower strain region, thereby increasing the electrical output of single large area layer of piezoelectric fiber material 33 as a whole.

The outputs of all rectifier bridges 35 on large area layer of piezoelectric fiber material 33 can be connected to traces 38a, 38b, delivered to pads 40a, 40b and to storage capacitor 42, which may also be located on insulator 20a'. Integrating rectifier bridge 35 on insulator 20a' for each smaller area 33' provides a way to easily implement a large number of such rectifier bridges 35 for different regions of large area layer of piezoelectric fiber material 33 without the need to provide a large number of pairs of external wires.

Wire crossings that may be needed for this arrangement can be provided on insulator 20a, 20a', as shown in FIG. 1a, 1b and in FIG. 2. Two-sided metalization on insulator 20a, 20a' and via 44 there between provides a way for trace 25 to cross under trace 46, as shown in FIG. 1b.

Figure 3A:
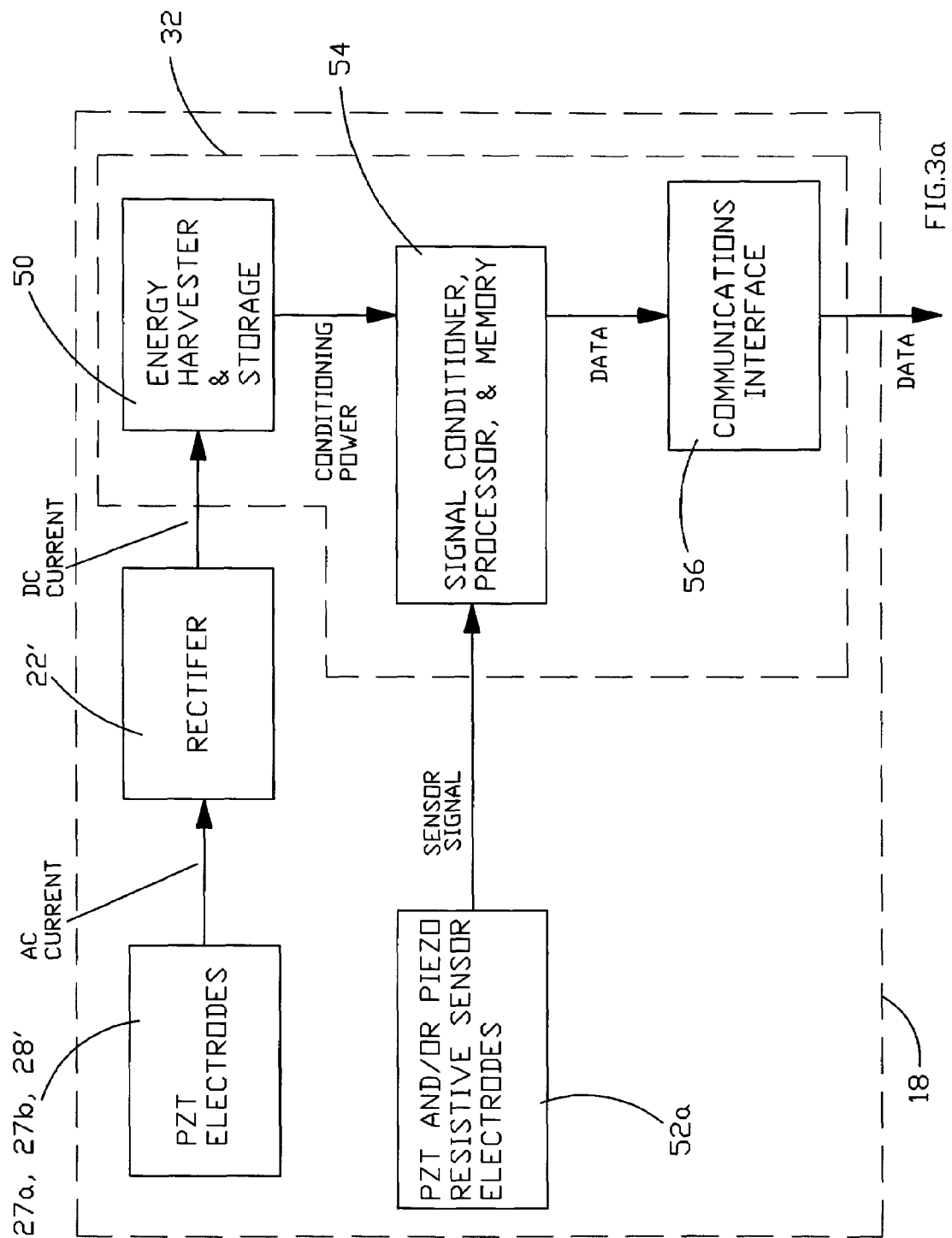
FIGS. 3a and 3b are block diagrams showing components that may be integrated on the piezoelectric composites of the various embodiments or that may be connected thereto.
Figure 3B:
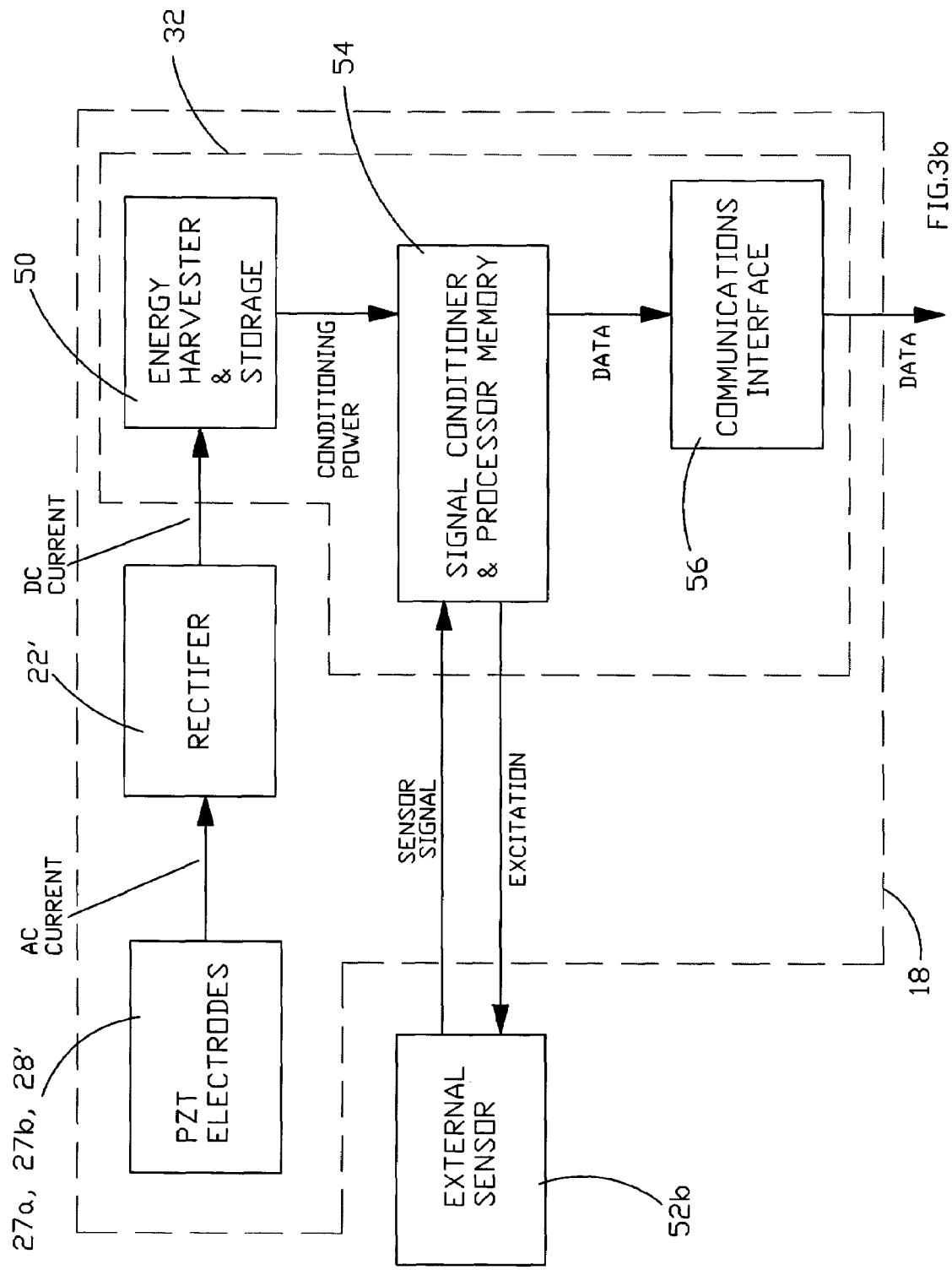

Energy harvesting circuit 50, sensor 52a, signal conditioning circuit 54, transmitter 56, and a signal generator circuit (not shown) could also be mounted on insulator 20a of FIGS. 1a, 1b or insulator 20a' of FIG. 2, as shown in FIG. 3a. Signal conditioning circuit 54 can include an A/D converter and a microprocessor. Energy harvesting circuit 50 can include a control switch, such as the nanoamp comparator described in the '693 patent, an energy storage device, and a voltage converter, such as a buck converter, to convert raw output of integrated piezoelectric composite 18 from a high voltage and a high impedance to a low voltage and low impedance. The energy storage device can include a capacitor and a battery, such as a thin film battery. Larger energy storage devices (not shown) can also be mounted separately from integrated piezoelectric composite 18 and connected to pads on integrated piezoelectric composite 18 with wires. Certain elements, such as sensor 56b can be located off insulator 20a. Wiring can be provided for connection there between, as shown in FIG. 3b. Sensor 52a, 52b can be a strain sensor mounted directly to substrate 29.

In another embodiment, standard off the shelf piezoelectric composites can be used. Additional circuit elements 70 are mounted to their own flex 72 that is mounted to make contact with standard contact pads 74 of standard piezoelectric composite 76, as shown in FIG. 4. Flex 72 may be adhesively attached to standard piezoelectric composite 76. Flex 72 includes all the pads 78 and interconnect wiring 80 for additional circuit elements 70, such as diode bridge 82 and integrated circuit 84.

Figure 5:
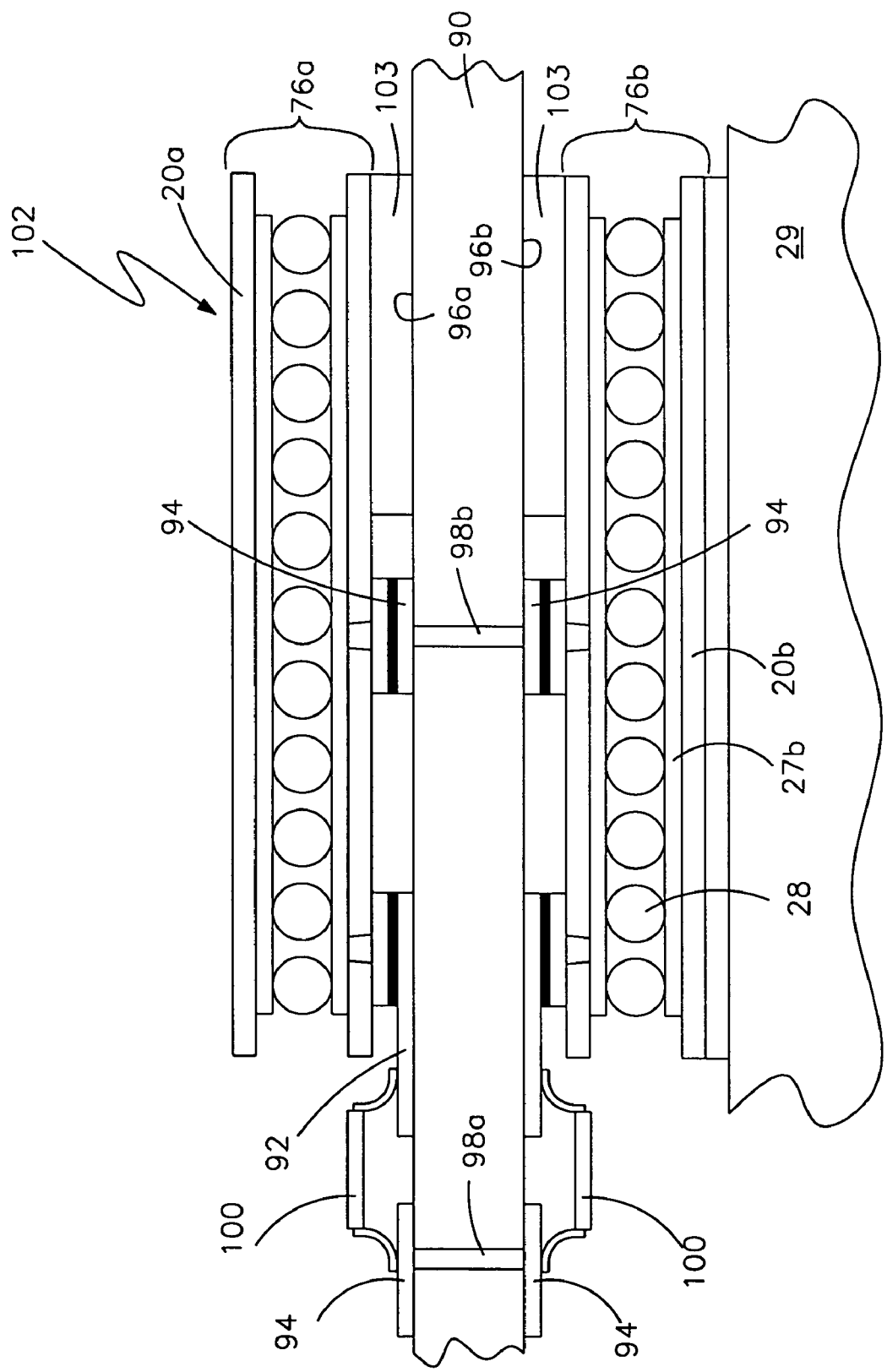
FIG. 5 is a cross sectional view of a stacked embodiment in which a standard piezoelectric composite is bonded to both sides of the flex layer of FIG. 4 and support circuits are mounted on a portion of the flex layer that extends beyond the standard piezoelectric composites.

Providing additional layer of flex 90 also advantageously facilitates stacking of standard piezoelectric composites 76a, 76b, as shown in FIG. 5 for improving the amount of energy harvested in an available area of substrate 29. Wiring traces 92 and pads 94 are provided on both surfaces 96a, 96b of flex 90.

Metal studs 98a, 98b are provided through flex 90 to provide contact between support circuits 100 and to provide ground connection between stacked standard piezoelectric composites 76a, 76b. This arrangement retains the advantages of reduced cost and simplified mounting to substrate 29 while providing integration of support circuits 100 on stacked piezoelectrics 102. Adhesive layers 103 are provided connecting bottom insulator to substrate 29 and connecting between flex 90 and standard piezoelectric composites 76a, 76b.

With standard piezoelectric composites 76a, 76b and flex 90 having thicknesses on the order of mils (0.025 mm), energy from vibration of substrate 29 is transmitted throughout stacked piezoelectrics 102 and harvested by support circuits 100 on one or both sides of flex 90 that are connected to both standard piezoelectric composites 76a, 76b. Support circuits 100 can include diode bridges. Support circuits 100 can also include components, such as an energy harvesting circuit, a capacitor, a battery, a sensor, a signal conditioning circuit, a processor, a transmitter, a receiver, and a transceiver, as shown in FIG. 3a. Only one such support circuit 100 may be required on one side of flex 90 for stacked standard piezoelectric composites 76a, 76b to serve both standard piezoelectric composites 76a, 76b. Since both standard piezoelectric composites 76a, 76b in stack 102 experience approximately the same level of strain and generate about the same amount of electricity at about the same time, separate diode bridges for each piezoelectric composite 76a, 76b may not be needed.

Because piezoelectric composite 76a is oppositely oriented compared to piezoelectric composite 76b in FIG. 5, these two piezoelectric composites 76a, 76b may generate electricity oppositely phased. Opposite output pads can be connected or outputs can be combined after rectifier bridge 22 to avoid output of one interfering with the other.

Figure 6A:
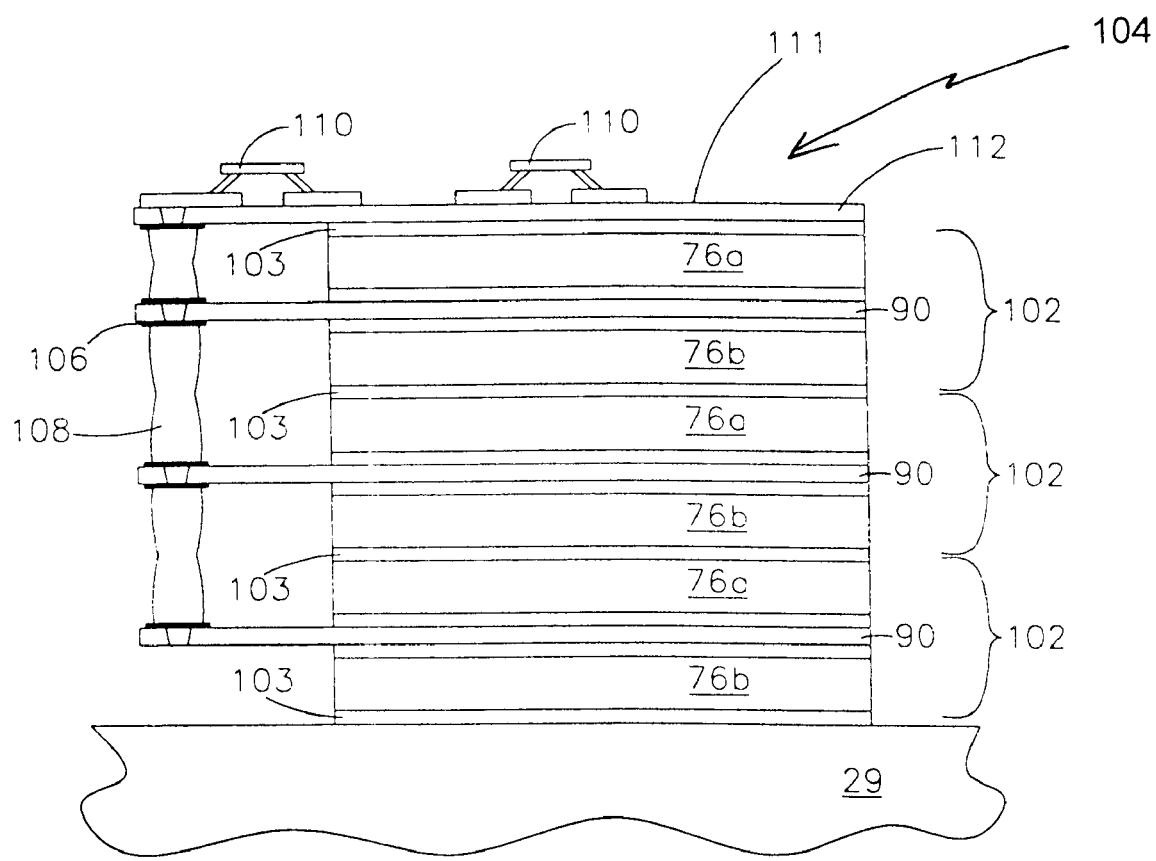
FIG. 6a is a cross sectional view of a large stack of the two layer stacks of FIG. 5 with support circuits mounted to a flex layer that extends on a top surface of the large stack.

Stacked piezoelectrics 102 can themselves be stacked to provide large stack 104 that includes more energy harvesting layers on the same area of substrate 29, as shown in FIG. 6a. In one embodiment, stacked piezoelectrics 102, each including a pair of standard piezoelectric composites 76a, 76b mounted on opposite sides of flex 90, as shown in FIG. 5, are stacked on each other with adhesive 103 as shown in FIG. 6a. In this case flex 90 between each pair of the stacked piezoelectrics 102 extends sufficiently beyond standard piezoelectric composites 76a, 76b so pads 106 on each flex 90 can be connected with solder or conductive epoxy connectors 108. Since standard piezoelectric composites 76a, 76b in large stack 104 are all mounted on the same area of substrate 29 they are all expected to experience approximately the same level of strain and generate about the same amount of electricity at about the same time, so separate diode bridges for each standard piezoelectric composite 76a, 76b in larger stack 104 may not be needed. Alternatively, if desired, diode bridges 110 for each standard piezoelectric composite 76a, 76b in larger stack 104 can be provided, along with other support circuitry, on top surface 111 of flex 112 on large stack 104. In this case a pair of wires extending from each standard piezoelectric composite 76a, 76b to flex 112 can be provided extending to diode bridge 110 for that particular standard piezoelectric composite 76 on flex 112.

Figure 6B:
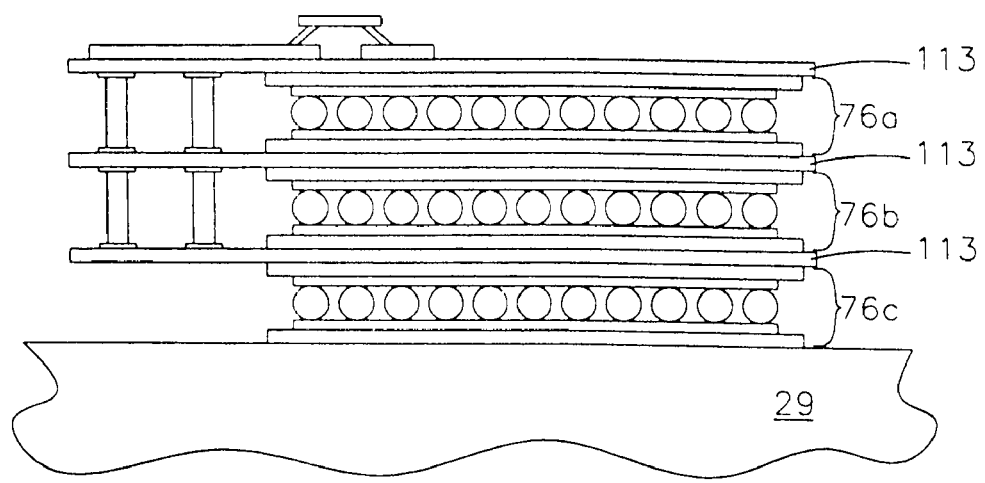
FIG. 6b is a cross sectional view of another embodiment of a large stack including flexes for each piezoelectric composite and in which the flexes are interconnected to each other and to support circuits.

Alternatively, a stack of standard piezoelectric composites 76a, 76b each with its own flex 113 bonded and similarly interconnected can also be provided, as shown in FIG. 6b.

Figure 6C:
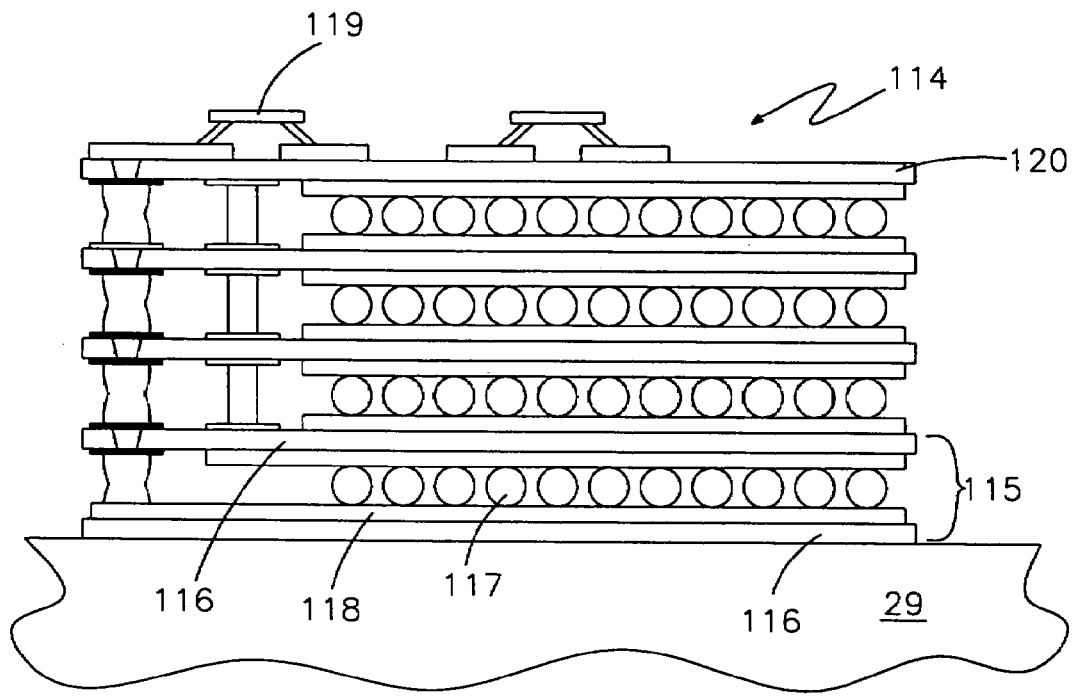
FIG. 6c is a cross sectional view.
Figure 6C:
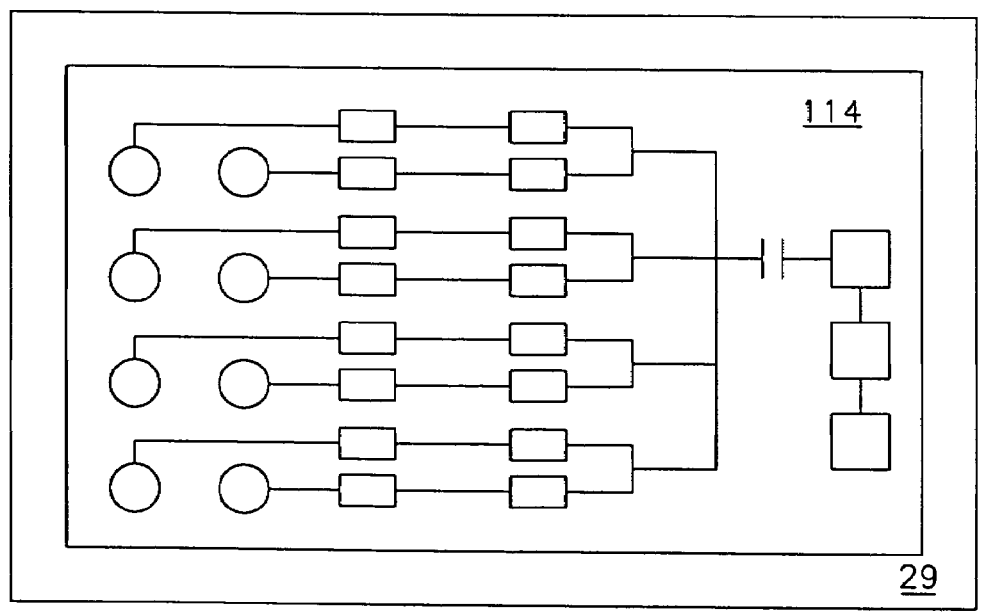

Integrated piezoelectric stack 114 of individual layers 115 can be mounted on substrate 29, each individual layer 115 including integrated insulator 116 that extends beyond piezoelectric element 117 to provide connection from each electrode 118 through each overlying integrated insulator 116 to a diode bridge 119 on top insulator 120, as shown in FIG. 6c, 6c'. Electrodes 118 of each layer 115 can have a separate path to top insulator 120 where a separate diode bridge is provided for each pair of electrodes. Alternatively, positive electrodes and negative electrodes of each layer 115 can be joined in common and connected to a single diode bridge on top surface 120.

Figure 7A:
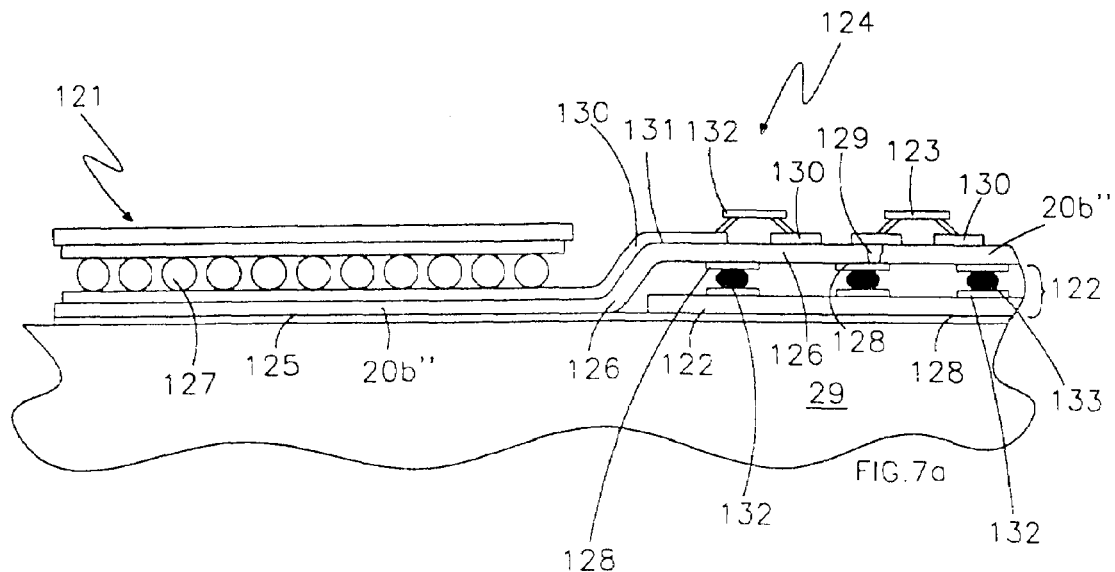
FIG. 7a is a cross sectional view of another embodiment of the piezoelectric composite of FIG. 1a, 1b having one of its insulating layers including a strain gauge and support circuits.

In another embodiment, piezoelectric composite 121 can be integrated with a sensor, such as strain gauge 122, and support circuit 123 to provide integrated sensor and piezoelectric energy harvester 124, as shown in FIG. 7a. In one approach, strain gauge 122 is adhesively mounted to lower surface 125 of lower insulator 20b'', and both are then adhesively mounted to substrate 29. Insulator 20b'' can include portion 126 that extends beyond piezoelectric element 127. Portion 126 of insulator 20b'' includes pad 128 on its lower surface 125 and via 129 that provides contact between pad 128 and pad 130 on its upper surface 131. Pad 132 of strain gauge 122 is aligned with pad 128 on lower surface 125 of insulator 20b'' and connected with solder or conductive epoxy 133. Upper surface 131 of portion 126 provides contact pads for the two electrodes of piezoelectric composite 121 and is also a carrier for diode bridge 132 and for other support circuitry, such as support circuit 123.

Figure 7B:
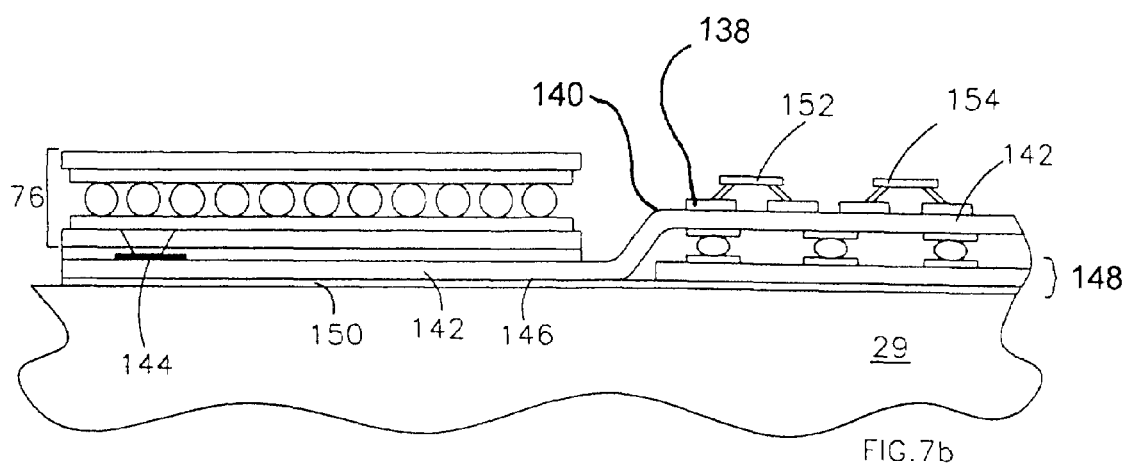
FIG. 7b is a cross sectional view of another embodiment including a flex bonded to a standard piezoelectric composite in which a strain gauge and support circuits are mounted on the flex.

In another approach, pad 138 on top surface 140 of flex 142 contacts pad 144 of standard piezoelectric composite 76, as shown in FIG. 7b. Bottom surface 146 of flex 142 includes piezoresistive strain gauge 148 and adhesive layer 150 for mounting to substrate 29. Top surface 140 of flex 142 provides contact to the two electrodes of standard piezoelectric composite 76 and is also a carrier for additional support circuitry, such as diode bridge 152 and support circuit 154 for strain gauge 148.

Strain gauges 122 and 148 can have two pads. They can also include two gauges perpendicular to each other with a shared pad, as shown in FIGS. 7a, 7b. They can be rosettes which can have 3 strain gauges, each with two pads, angled to one another to obtain strain information from different directions.

An integrated piezoelectric composite and support circuit of one of the embodiments of the present patent application could be provided on a ship bulkhead or on a vibrating machine to generate electricity from vibration of the ship or the machine as described in US publication patent application number 20050146220. It can also be provided on structures subject to impact, such as landing gear, to generate electricity from the impact of landing. It can also be provided on a weapon to generate electricity from the impact of firing the weapon. It can also be provided on a rotating part, such as a helicopter rotor blades or to a part, such as a helicopter pitch link to generate electricity from strains or vibration induced in those parts. It can also be provided on suspension systems, such as on a truck's composite leaf springs to generate electricity from strains from flexing of the spring. It can also be provided as part of an energy harvesting system within a car tire to generate electricity from flexing of the tire as it rotates, as described in US publication patent application number 20050146220. Many other components on vehicles and structures, such as fixed and rotary wing aircraft, trucks, tanks, earth moving machines, mining machines, buildings, bridges, pipes, and wind turbines could be instrumented with an integrated piezoelectric composite and support circuit of this patent application, providing a smart, energy harvesting sensor and/or actuating component.

Structures with integrated piezoelectric composites and support circuits that harvest energy, provide and analyze sensor data, and transmit data would be able to provide health management functions, including embedded test & evaluation (ET &E), health usage monitoring (HUMS), and structural health monitoring (SHM). The use of the piezoelectric composite as an actuator to provide signals to the component adds further test and evaluation capability, as described in the '731 application. This smart component could compute its usage profile and estimate remaining life span without the need for a battery maintenance schedule. Each smart component could include a unique identification code, such as the 92 bit electronic product code which would allow its usage data to be recorded in a data base that would allow for improved condition based maintenance of each component and of the equipment that includes each component.

Figure 8:
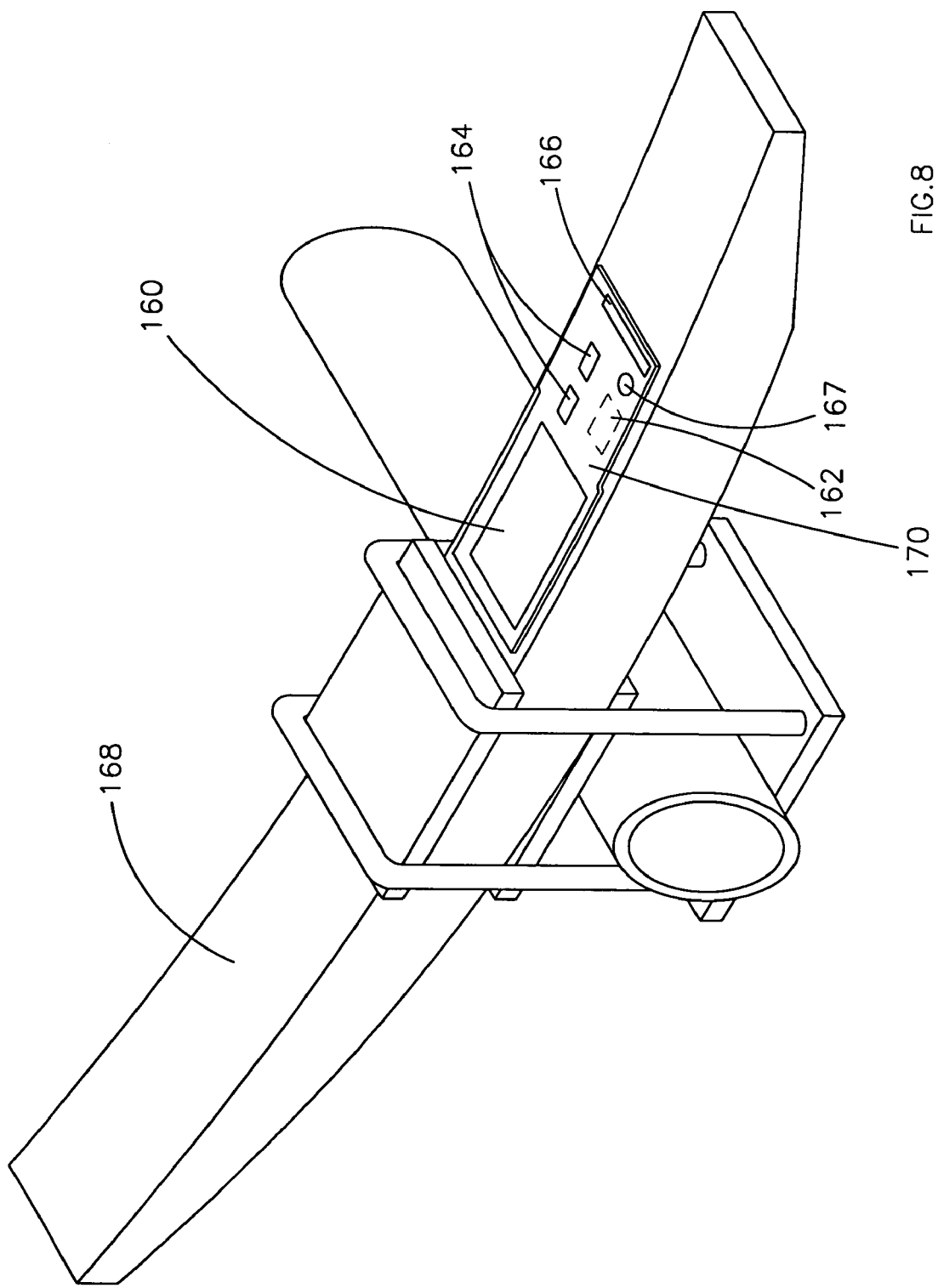
FIG. 8 is a three dimensional view of a leaf spring with the integrated piezoelectric composite mounted thereto.

Use of integrated piezoelectric composites and support circuits on a leaf spring is shown in FIG. 8 as an illustrative example. In addition to piezoelectric composite 160 and piezoresistive strain gauge 162, support circuit 164 is integrated on piezoelectric energy harvesting element 160 includes rectifier bridges serving different portions of piezoelectric energy harvesting element 160, a storage capacitor, microprocessor, signal conditioning circuit, RF transceiver, RF antenna 166 and battery 167. Support circuit 164 can also include a signal generator to provide signal to leaf spring 168 for crack detection, as described in the commonly assigned 115-028 patent application, incorporated herein by reference. Insulation, electromagnetic interference shielding, a protective overcoat, and encapsulation (not shown for clarity) are also provided.

Negative effect of non-uniform strains in leaf spring 168 are mitigated by segmenting piezoelectric composite 160 into portions, each with its own rectifier bridge, and by integrating these rectifiers on insulator of piezoelectric composite 160, as described herein above. By also integrating other support circuit elements on piezoelectric composite 160 further advantage in cost reduction, size, and ease of assembly on a structure are obtained.

In addition to processing data for fatigue analysis, the strain data from strain gauge 160 on leaf springs 168 located near all four corners can be used to determine the operating loads borne by the leaf spring and by the vehicle. Knowledge of the operating loads can be used to classify and analyze vehicle operations and vehicle operating regimes. The amount of time that a vehicle is used in various operating regimes can be logged in a non-volatile memory by the on board embedded processors located permanently on the vehicle's structural elements. The method of classifying operation of a structure on a vehicle, the time spent in that operation, calculating fatigue of the structure from strain gauges bonded to that structure, and transmitting the data, is described in the '777 application. The classification can distinguish rough or smooth road conditions, for example and the time spent on each. This information is useful to the owners and operators of the vehicles in order to facilitate condition based maintenance of the structure monitored and adjacent vehicle components since accumulated damage estimation is facilitated by a historic knowledge of a vehicle's particular operating regimes. This historic record could be sent to a remote location in real time via cellular telephone or satellite uplink to allow the owners of the vehicle to better maintain various components or to take action to prevent conditions that could lead to early failure.

In addition, the loads borne by suspension elements may be useful to aid in balancing the weight carried by the vehicle and to estimate the weight of the material carried by the vehicle. The smart composite leaf springs as described in this patent application could provide an output estimate of the vertical static load borne by the springs by using strain data combined with a calibration record. The calibration record could be stored in the embedded processor's non volatile memory. For a given strain reading, the processor can relate that strain reading to a corresponding load. This relationship could be linear or non linear, and may include temperature compensation routines, and may use look up methods, or direct computational means. Calibration can be accomplished by providing known loads to the vehicle and recording the response from the known loads in the strain gauges and creating a data file of known loads vs. response. Alternatively, load vs. strain response data can be provided for each instrumented leaf spring or other structural component, such as a helicopter pitch link, from measurements at the factory.

With smart leaf springs located near each supporting corner of a wheeled vehicle, the sum of loads provided from each corner could be used to estimate the payload carried by the vehicle and its center of gravity location relative to the vehicle's four leaf spring locations. The weight of the load can be determined from the sum of the strain responses at each corner. The weight can be determined from a table that provides a relationship between the measured total strain and the known loads applied. If the strains measured at the four corners varies significantly then this would indicate an unbalanced load, and corrective action could be taken to prevent excess wear and tear on the suspension element subject to the greatest load.

Furthermore, should the vehicle be operated in a manner which may place the vehicle's structure, components, or its operators at risk, the embedded monitoring system could provide a warning in real time to a display in clear view of the operator. Alternatively, this warning could be sent to a remote location via cellular telephone or satellite uplink.

Layers of encapsulation, shielding, and a protective cover can be provided for the integrated piezoelectric composite and support circuit, as described in the '244 application.

While the disclosed methods and systems have been shown and described in connection with illustrated embodiments, various changes may be made therein without departing from the spirit and scope of the invention as defined in the appended claims.

The invention claimed is:

1. A module, comprising a first piezoelectric element, a second piezoelectric element, a first electronic device, a second electronic device, a first insulating layer, a second insulating layer, and a single energy harvesting circuit, wherein said first insulating layer is mounted on said first piezoelectric element, wherein said first insulating layer includes a pattern of wiring traces, wherein said first electronic device is mounted on said first insulating layer and is electrically connected to said first piezoelectric element, wherein said second insulating layer is mounted on said second piezoelectric, wherein said second insulating layer includes a pattern of wiring traces, wherein said second electronic device is mounted on said second insulating layer and is electrically connected to said second piezoelectric element, wherein said first electronic device includes a first rectifier and wherein said second electronic device includes a second rectifier, wherein outputs of said first rectifier and said second rectifier are connected to said single energy harvesting circuit.

2. A module as recited in claim 1, wherein said first rectifier includes a full bridge rectifier.

3. A module as recited in claim 1, wherein said first insulating layer has a first side and a second side, wherein said first piezoelectric element is mounted on said first side, wherein said first electronic device is mounted on said second side.

4. A module as recited in claim 1, wherein said first insulating layer has a first side and a second side, wherein said first piezoelectric element is mounted on said first side, wherein said first electronic device is mounted on said first side.

5. A module as recited in claim 1, further comprising a wireless sensor module connected for receiving power derived from said energy harvesting circuit.

6. A module as recited in claim 5, wherein said wireless sensor module includes a strain gauge.

7. A module as recited in claim 1, wherein said first insulating layer includes polyimide.

8. A module, comprising a first piezoelectric element a first electronic device, a flex, a second insulating layer, and a contact to said first piezoelectric element, wherein said first piezoelectric element provides physical support for said first electronic device, wherein said flex is mounted on said first piezoelectric element, wherein said first electronic device is mounted on said flex for providing an electronic support function to said first piezoelectric element, wherein said second insulating layer is bonded to said first piezoelectric element, wherein said contact to said first piezoelectric element extends through said second insulating layer.

9. A module as recited in claim 8, wherein said flex includes a first side and a second side, said second side opposite said first side, wherein said first side includes said first piezoelectric element, wherein said second side includes said first electronic device.

10. A module as recited in claim 8, wherein said flex includes a first side and a second side, said second side opposite said first side, wherein said first side includes said first piezoelectric element, wherein said first side includes said first electronic device.

11. A module as recited in claim 8, further comprising a sensor, wherein said sensor is mounted on said flex.

12. A module as recited in claim 10, wherein said sensor includes a strain gauge.

13. A module, comprising a first piezoelectric element, a second piezoelectric element, a first electronic device, and a first insulating layer, wherein said first insulating layer is mounted on said first piezoelectric element, wherein said first electronic device is mounted on said first insulating layer for providing an electronic support function to said first piezoelectric element, wherein said second piezoelectric element is stacked on said first piezoelectric element.

14. A module as recited in claim 13, wherein said first insulating layer includes a first side and a second side, said second side opposite said first side, wherein said first piezoelectric is mounted on said first side and wherein said second piezoelectric is mounted on said second side.

15. A module as recited in claim 14, wherein said first insulating layer includes a flex.

16. A module as recited in claim 13, further comprising a second insulating layer, wherein said first insulating layer is mounted on said first piezoelectric and wherein said second insulating layer is mounted on said second piezoelectric.

17. A module as recited in claim 13, wherein said first insulating layer extends beyond said stacked first and second piezoelectric elements for supporting said first electronic device.

18. A module as recited in claim 17, wherein said first insulating layer is an integral part of said stacked first and second piezoelectric elements.

19. A module as recited in claim 1, further comprising at least one member from the group consisting of a signal conditioning circuit and a signal generating circuit, wherein said at least one member is connected for receiving power derived from said energy harvesting circuit.

20. A module as recited in claim 19, wherein said energy harvesting circuit further includes at least one from the group consisting of a storage capacitor, a battery, and a voltage converter.

21. A module, comprising a first piezoelectric element, a first electronic device, a second electronic device, and a first insulating layer, wherein said first insulating layer is mounted on said first piezoelectric element, wherein said first insulating layer includes a first pair of contacts to said first piezoelectric element and a second pair of contacts to said first piezoelectric element, wherein said first electronic device is mounted on said first insulating layer and is connected to said first pair of contacts and wherein said second electronic device is mounted on said first insulating layer and is connected to said second pair of contacts.

22. A module as recited in claim 21, wherein said first electronic device includes a first rectifier and wherein said second electronic device includes a second rectifier.

23. A module as recited in claim 22, wherein said first rectifier and said second rectifier include full bridge rectifiers.

24. A module as recited in claim 22, wherein outputs of said first rectifier and said second rectifier are connected to a single storage capacitor.

25. A module as recited in claim 22, wherein outputs of said first rectifier and said second rectifier are connected to a single energy harvesting circuit.

26. A system, comprising a piezoelectric element, a first pair of electrodes, a second pair of electrodes, a first rectifying circuit, and a second rectifying circuit, wherein said first pair of electrodes contacts said piezoelectric element and wherein said second pair of electrodes contacts said piezoelectric element, wherein said first pair of electrodes contacts said piezoelectric element in a separate location from said second pair of electrodes, wherein said first rectifying circuit includes a first pair of inputs connected to said first pair of electrodes, wherein said second rectifying circuit includes a second pair of inputs connected to said second pair of electrodes, wherein said piezoelectric element provides physical support for said first and said second pairs of electrodes and for said first and said second rectifying circuits.

27. A system as recited in claim 26, further comprising a single energy harvesting circuit, wherein said first rectifying circuit includes a first pair of outputs connected to said single energy harvesting circuit, wherein said second rectifying circuit includes a second pair of outputs connected to said single energy harvesting circuit.

28. A system as recited in claim 27, wherein said single energy harvesting circuit includes a capacitor, wherein said piezoelectric element provides physical support for said capacitor.

29. A system as recited in claim 27, wherein said piezoelectric element provides physical support for said single energy harvesting circuit.

30. A module as recited in claim 26, wherein said first rectifying circuit is mounted on said piezoelectric element.

31. A module as recited in claim 5, wherein said wireless sensor module further includes a first support circuit, wherein said first support circuit includes at least one from the group consisting of a processor, a memory, and a signal conditioning circuit.

32. A module as recited in claim 5, wherein said wireless sensor module further includes a second support circuit, wherein said second support circuit includes at least one from the group consisting of a transmitter, a receiver, a transceiver, and a signal generating circuit.

33. A module as recited in claim 8, wherein said first electronic device includes a rectifier.

34. A module as recited in claim 8, further comprising a second piezoelectric element, wherein said flex is mounted on said second piezoelectric element.

35. A module as recited in claim 34, wherein said second piezoelectric element is stacked on said first piezoelectric element, said flex there between.

36. A module as recited in claim 34, wherein said first electronic device provides an electronic support function to both said first piezoelectric element and to said second piezoelectric element.

37. A module as recited in claim 34, further comprising a second electronic device, wherein said second electronic device provides an electronic support function to said second piezoelectric element.

38. A module as recited in claim 13, wherein said first electronic device provides an electronic support function to both said first piezoelectric element and to said second piezoelectric element.

39. A module as recited in claim 13, further comprising a second electronic device, wherein said second electronic device provides an electronic support function to said second piezoelectric element.

40. A module as recited in claim 39, wherein said second electronic device is mounted on said first insulating layer.

41. A system as recited in claim 26, further comprising a structure wherein said piezoelectric module is mounted to said structure to receive mechanical energy from said structure and convert said mechanical energy into electrical energy, wherein said structure includes at least one from the group consisting of a component of a vehicle, a structural element of a building, and a structural element of infrastructure.

42. A system as recited in claim 41, wherein said component of a vehicle includes a tire.

43. A system as recited in claim 41, wherein said component of a vehicle includes a leaf spring.

44. A system as recited in claim 41, wherein said structural element of infrastructure includes at least one from the group including a bridge and a pipe.

45. A system as recited in claim 41, wherein said vehicle includes an aircraft, a car, a truck, and earth moving equipment.

* * * * *